(12) United States Patent
Tajiri et al.

(10) Patent No.: US 6,342,402 B1
(45) Date of Patent: Jan. 29, 2002

(54) LIGHT EMITTING DIODE ARRAY AND METHOD OF FORMING THE SAME

(75) Inventors: Tomoyoshi Tajiri; Takao Kusano; Kazuya Ohkawa, all of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/459,596

(22) Filed: Dec. 13, 1999

Related U.S. Application Data

(62) Division of application No. 08/752,943, filed on Nov. 21, 1996, now Pat. No. 6,054,723.

(30) Foreign Application Priority Data

Nov. 22, 1995 (JP) .............................................. 7-304624

(51) Int. Cl.$^7$ .............................................. H01L 21/00
(52) U.S. Cl. ...................................................... 438/34
(58) Field of Search .............................. 438/34, 35, 46, 438/47, 602, 604, 605; 257/13, 48, 83, 86, 99; 430/311

(56) References Cited

U.S. PATENT DOCUMENTS

| | | | |
|---|---|---|---|
| 4,145,707 A | 3/1979 | Sadamasa et al. ............. | 257/86 |
| 4,924,276 A | 5/1990 | Heime et al. .................. | 257/99 |
| 4,951,098 A | 8/1990 | Albergo et al. ................ | 257/48 |
| 4,984,035 A | 1/1991 | Kanzawa et al. .............. | 257/93 |
| 5,523,590 A * | 6/1996 | Ogihara et al. ............... | 257/88 |
| 5,869,221 A | 2/1999 | Ogihara et al. .............. | 430/311 |

FOREIGN PATENT DOCUMENTS

JP        07122781        5/1993

* cited by examiner

*Primary Examiner*—Keith Christianson
(74) *Attorney, Agent, or Firm*—Venable; Robert J. Frank; Allen Wood

(57) ABSTRACT

A light emitting diode array includes a light emitting area formed on a semiconductor substrate, a diffusion prevention layer formed on the semiconductor substrate, and an insulating layer formed on the diffusion prevention layer. The diffusion prevention layer has a lower edge and the insulating layer has a level drop at this lower edge. An interconnection conductor extends on the insulating layer and is in ohmic contact with the light emitting region through holes in the insulating layer and the diffusion prevention layer. The interconnection conductor has a stepped portion at the level drop of the insulating layer, the stepped portion being located in a wide-width segment of the interconnection conductor. A method for forming such a light emitting diode array includes the steps of providing a semiconductor substrate, forming a light emitting region on the substrate, forming a diffusion prevention layer on the substrate surrounding the light emitting region, forming in insulating layer on the diffusion prevention layer, covering the light emitting region and the insulating layer with a conductive layer, forming a mask layer on a predetermined portion of the conductive layer, the mask layer having a wide-width segment located on the stepped portion, and selectively forming the interconnection conductor by etching the conductive layer using the mask layer. Several embodiments of both the method and the array are disclosed.

11 Claims, 8 Drawing Sheets

LIGHT EMITTING DIODE ARRAY AND METHOD OF FORMING THE SAME

CROSS REFERENCE TO RELATED APPLICATION

This application claims the benefit of priority of application Ser. No. 304624/1995, filed Nov. 22, 1995 in Japan, the subject matter of which is incorporated herein by reference. Furthermore, the present application is a division of application Ser. No. 08/752,943, filed Nov. 21, 1996 U.S. Pat. No. 6,054,723.

BACKGROUND OF THE INVENTION

1. Field of the Invention

The present invention relates to a light emitting diode (LED) array employable in an electronic printer for photolithography, and particularly to the structure of a plurality of interconnection conductors in the LED array.

2. Description of the Related Art

FIG. 8 is a schematic top plan view showing light emitting diodes (LEDs) 10 in a portion of a prior art LED array 12. FIG. 9 is a cross-sectional view taken along line 9—9 of FIG. 8.

The process of fabricating the prior art light emitting diode array 12 is as follows:

First, an $Al_2O_3$ layer 14 acting as a diffusion prevention layer is formed in a N-GaAs substrate 16. Then, an insulating layer 18 such as $Si_3N_4$ is formed on the $Al_2O_3$ layer 14. Then, a P-type impurity such as Zn is diffused into portions of the surface of the N-GaAs substrate 16 that are not covered by the $Al_2O_3$ layer 14 and the insulating layer 18 by the vapor diffusion method. As a result, p-GaAsP regions 20 are formed in the N-GaAs substrate 16. The regions 20 act as light emitting areas. Then, interconnection conductors 22 are formed. The interconnection conductors 22 are in ohmic contact with the p-GaAsP regions 20, and extend from the regions 20 over stepped portions 24 to the top surface of the insulating layer 14. In this application, a "stepped portion" of a conductor refers to a portion of the conductor where its height or level changes abruptly in one or more steps.

SUMMARY OF THE INVENTION

It is an object of the present invention to provide a light emitting diode array that is able to free from a disconnection due to a current concentration without sacrificing the light outputting efficiency of the LED array.

It is another object of the present invention to provide a light emitting diode array having a reduced area and thus a reduced cost.

It is another object of the present invention to provide a light emitting diode array in which the outer interconnection conductors are located close to the locations where the die of the array is cut from a semiconductor slice. Therefore, a reduction in the area of the light emitting diode array die can be achieved and a margin for cutting the die can be secured.

It is another object of the present invention to provide a light emitting diode array that is able to prevent a direct influence of an electric field at the transition from a wide-width segment of an interconnection-conductor to a narrow-width segment of the interconnection conductor.

According to one aspect of the present invention, there is provided a light emitting diode array comprising a semiconductor substrate; a diffusion prevention layer formed on the semiconductor substrate, the diffusion prevention layer having a hole which exposes the light emitting region and having an edge that is spaced apart from the hole; an insulating layer formed on the diffusion prevention layer, the insulating layer having a level drop at the edge of the diffusion prevention layer; and an interconnection conductor which extends on the insulating layer and which has a stepped portion at the level drop of the insulating layer, the interconnection conductor including a wide-width segment and a narrow-width segment which is in ohmic contact with the light emitting region, the stepped portion of the interconnection conductor being located in the wide-width segment.

The wide-width segments of the interconnection conductor may be asymmetrical with respect to the path of the interconnection conductor, and protrude away from the nearest edge of the die.

The interconnection conductor may have a border with curved or arcuate portions where the wide-width segment joins the narrow-width segment (or more than one narrow-width segment).

The present invention is also directed to a method of forming a light emitting diode array.

It is an object of the present invention to provide a method of forming a light emitting diode array that is able to reduce the risk that an interconnection conductor might be cut by etchant which gathers at a stepped portion of the interconnection conductor during a patterning step of the interconnection conductor.

It is another object of the present invention to provide a method which is able to reduce the area of a light emitting diode array die, and therefore reducing costs.

It is another object of the present invention to provide a method of forming a light emitting diode array which has low contact resistance at the light emitting regions by using AuBe or AuZn.

According to one aspect of the present invention, there is provided a method of forming a light emitting diode array, comprising the steps of providing a semiconductor substrate; forming a diffusion prevention layer on the semiconductor substrate, the diffusion prevention layer having an edge; forming a hole in the diffusion prevention layer at a position that is spaced apart from the edge of the diffusion prevention layer; forming a light emitting regions on the substrate beneath the hole; forming an insulating layer on the diffusion prevention layer, the insulating layer having a level drop at the edge of the diffusion prevention layer, the insulating layer additionally having a hole which is aligned with the hole in the diffusion prevention layer; covering the light emitting region and the insulating layer with a conductive layer, the conductive layer having a stepped portion at the level drop of the insulating layer; forming a mask layer on a predetermined portion of the conductive layer, the mask layer having a wide-width segment located over the stepped portion and a narrow-width segment which extends over the light emitting region; and selectively forming an interconnection conductor by etching the conductive layer using the mask layer.

According to another aspect of the present invention, there is provided a method of forming a light emitting diode array, comprising the steps of providing a semiconductor substrate; forming a diffusion prevention layer on the semiconductor substrate, the diffusion layer having an edge; forming a hole in the diffusion prevention layer at a position that is spaced apart from the edge of the diffusion prevention layer; forming a light emitting region on the substrate beneath the hole; forming an insulating layer on the diffusion prevention layer, the insulating layer having a level drop at the edge of the diffusion prevention layer, the insulating layer additionally having a hole which is aligned with the hole in the diffusion prevention layer; covering the light emitting region and the insulating layer with a thick conductive layer which has a recess that is aligned with the holes; forming a first mask layer on a first predetermined portion of the conductive layer, the first predetermined portion being located adjacent the recess in the conductive layer; conducting a first etching step to reduce the thickness of the conductive layer except beneath the first mask layer; removing the first mask layer; forming a second mask layer on a second predetermined portion of the conductive layer, the second mask layer having a wide-width segment located over the stepped portion and a narrow-width segment which extends over the light emitting region; and selectively forming an interconnection conductor by etching the conductive layer using the second mask layer.

According to another aspect of the present invention, there is provided a method of forming a light emitting diode array, comprising the steps of providing a semiconductor substrate; forming a diffusion prevention layer on the semiconductor substrate, the diffusion prevention layer having an edge; forming a hole in the diffusion prevention layer at a position that is spaced apart from the edge of the diffusion prevention layer; forming a light emitting region on the substrate beneath the hole; forming an insulating layer on the diffusion prevention layer, the insulating layer having a level drop at the edge of the diffusion prevention layer, the insulating layer additionally having a hole which is aligned with the hole in the diffusion prevention layer; selectively forming a staircase element having a lower portion which contacts the light emitting region and an upper portion which contacts the insulating layer, the staircase element being made of a first metal; covering the insulating layer, the staircase element, and the light emitting region with a layer of a second metal which has a faster etch rate than the first metal; forming a mask layer on a predetermined portion of the conductive layer; and selectively forming an interconnection conductor by etching the layer of the second metal using the mask layer. Here, the first metal layer may comprise AuBe or AuZn and the second metal layer may comprise Al.

BRIEF DESCRIPTION OF THE DRAWINGS

While the specification concludes with claims particularly pointing out and distinctly claiming the subject matter that is regarded as the invention, it is believed that the invention, along with the objects, features, and advantages thereof, will be better understood from the following description taken in connection with the accompanying drawings, in which:

DETAILED DESCRIPTION OF THE PREFERRED EMBODIMENTS (a) First Embodiment of a Light Emitting Diode Array A first embodiment of a light emitting diode array according to the present invention will hereinafter be described in detail with reference to the accompanying drawings.

Figure 1:
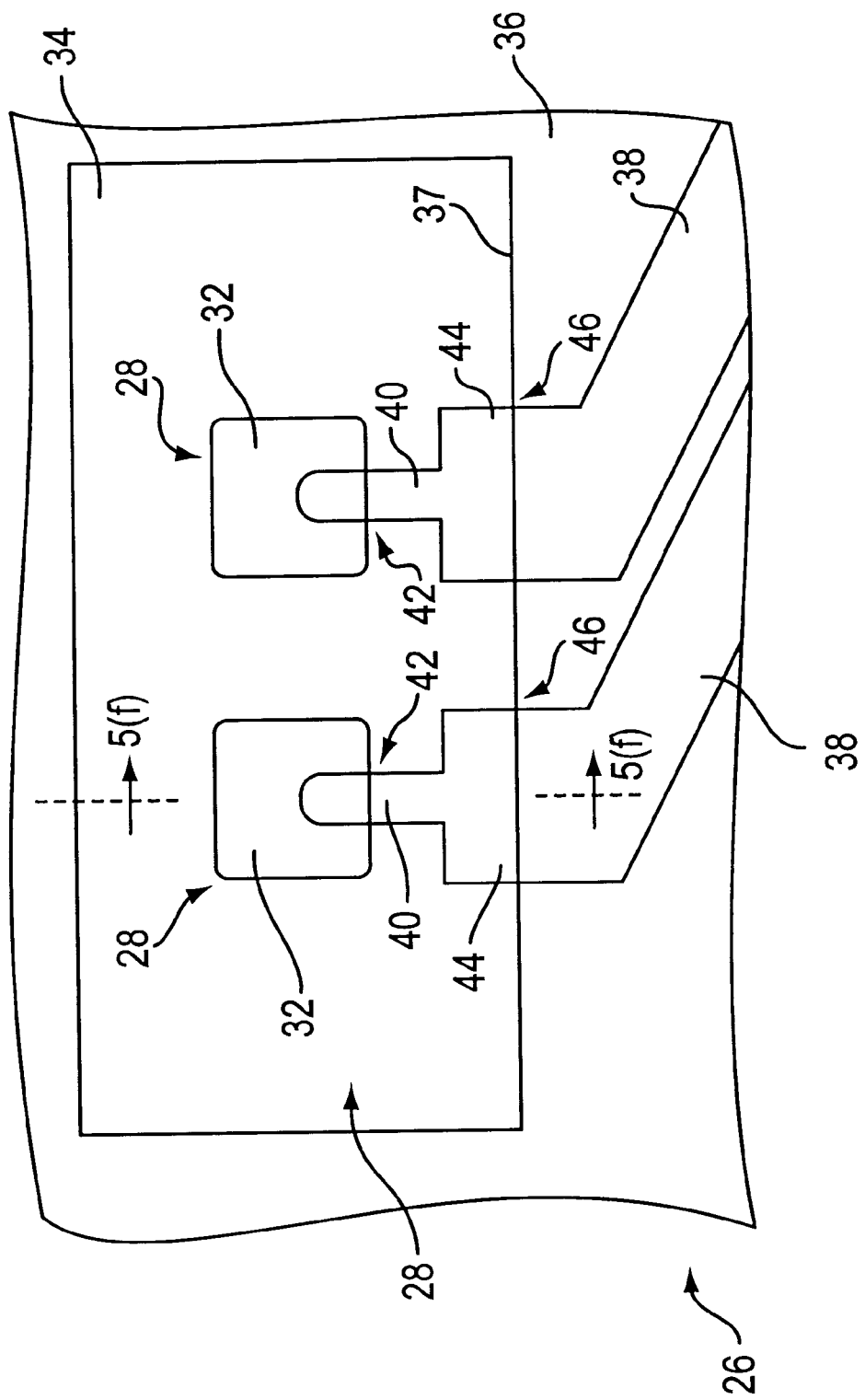
FIG. 1 is an enlarged plan view showing a portion of a light emitting diode array according to a first embodiment of the present invention.

Referring to FIG. 1, there is shown a portion of a light emitting diode array 26 according to a first embodiment of the present invention. The LED array 26 has a number of LEDs 28 which are disposed in a row, but only two of the LEDs 28 are shown in the portion of LED array 26 that is illustrated in FIG. 1. A cross-sectional view of one of the LEDs 28 is shown in FIG. 5(f).

Figure 5A:
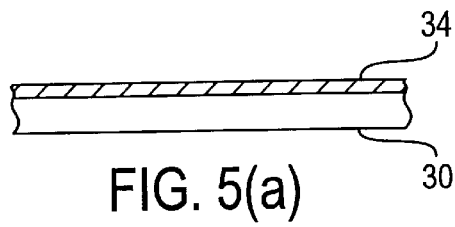
FIGS. 5(a)–5(f) are sectional views showing a method of forming the light emitting diode array of FIG. 1.
Figure 5B:
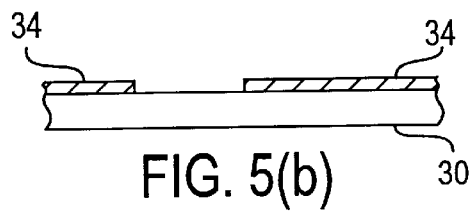
Figure 5C:
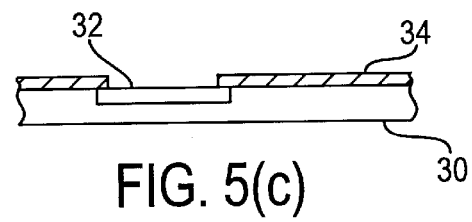
Figure 5D:
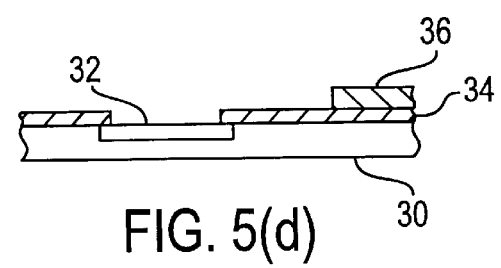
Figure 5E:
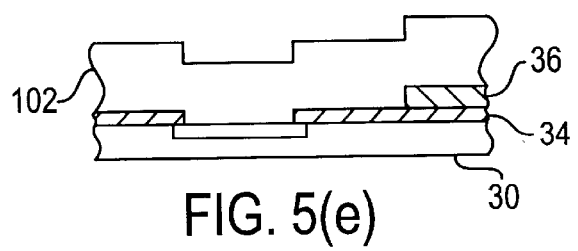
Figure 5F:
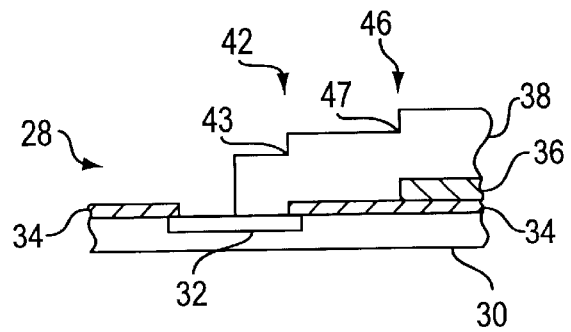
Figure 6A:
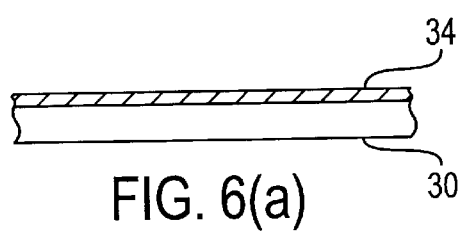
FIGS. 6(a)–6(i) are sectional views showing a method according to another embodiment of the present invention for forming a light emitting diode array.
Figure 6F:
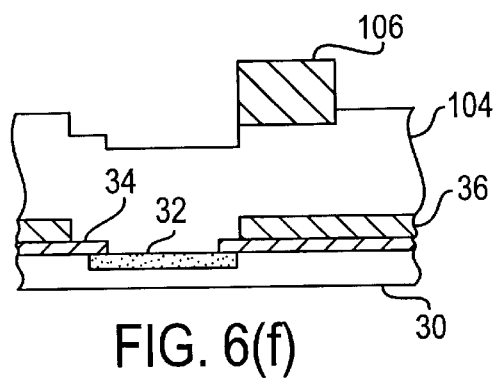
Figure 6B:
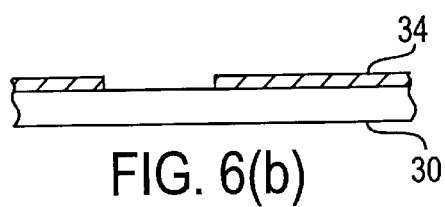
Figure 6G:
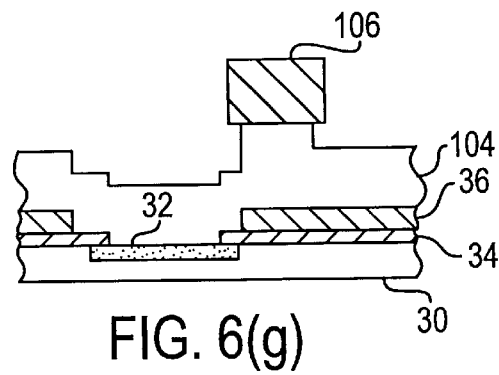
Figure 6C:
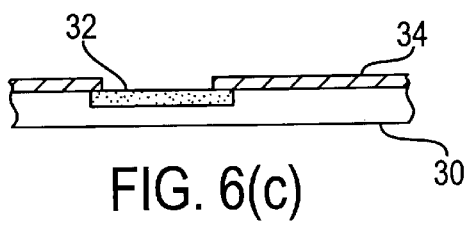
Figure 6D:
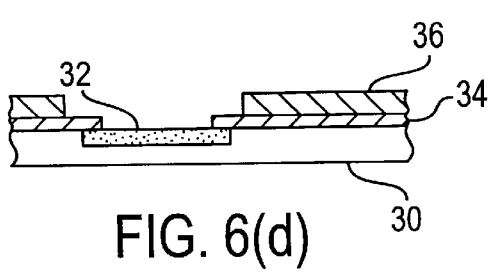
Figure 6H:
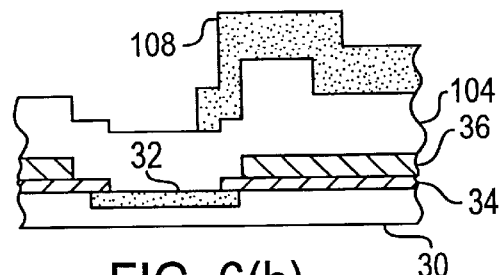
Figure 6E:
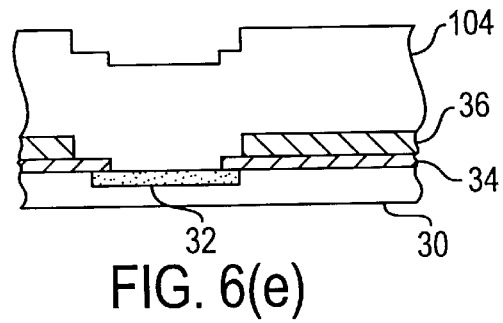
Figure 6I:
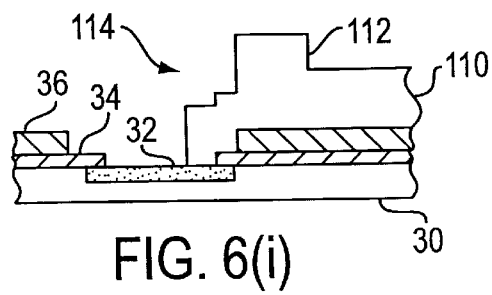
Figure 7A:
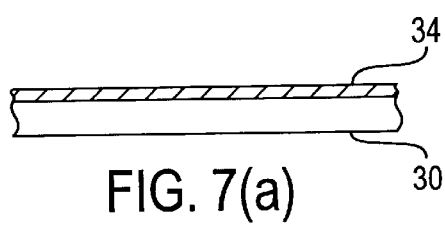
FIGS. 7(a)–7(i) are sectional views showing a method according to a further embodiment of the present invention for forming a light emitting diode array.
Figure 7F:
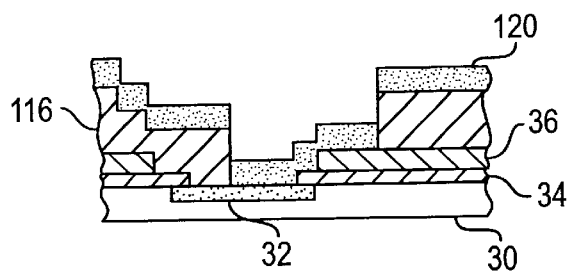
Figure 7B:
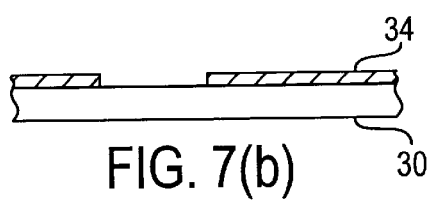
Figure 7C:
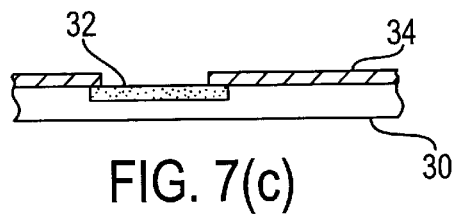
Figure 7G:
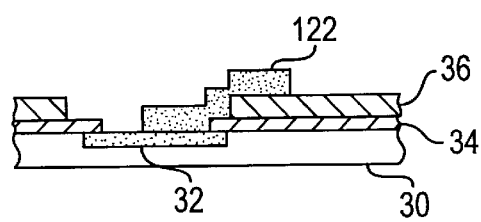
Figure 7H:
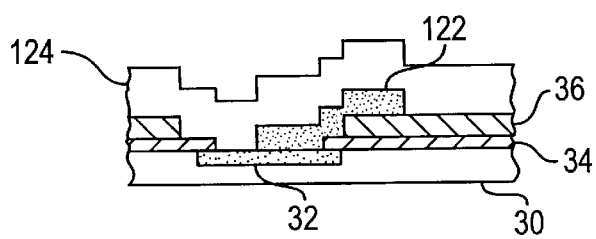
Figure 7D:
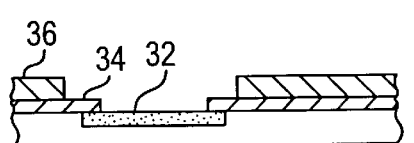
Figure 7E:
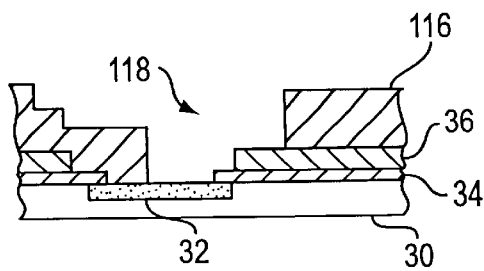
Figure 7I:
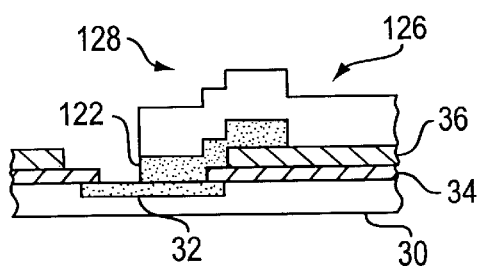
Figure 8:
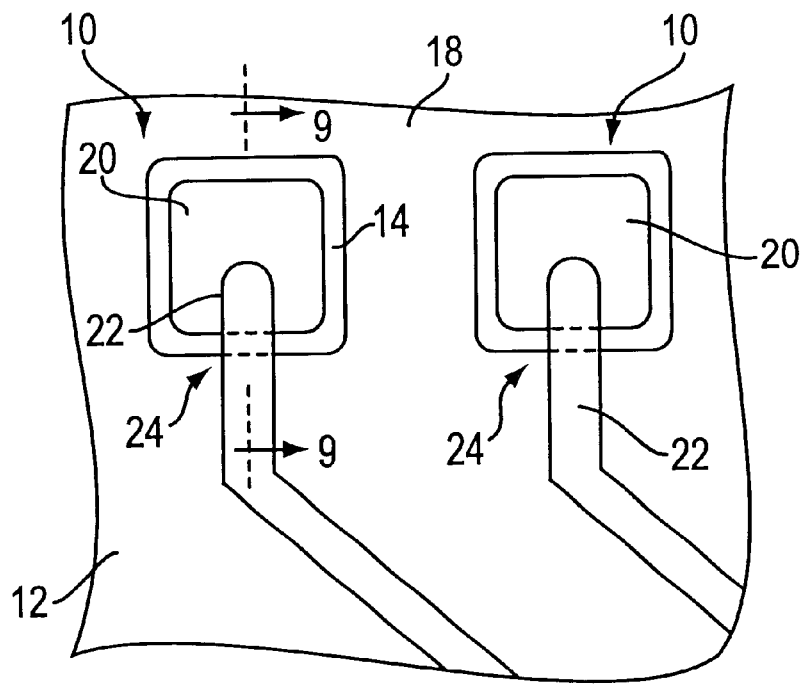
FIG. 8 is a schematic plan view showing a portion of a light emitting diode array in accordance with the prior art.

The LED array 26 according to the first embodiment of the present invention comprises an N-GaAs substrate 30 (see FIG. 5(f)) having a plurality of p-GaAsP regions 32 acting as light emitting regions. An $Al_2O_3$ layer 34 acting as a diffusion prevention layer is provided on substrate 30 and has windows which expose a surface of the regions 32. An insulating layer 36, such as $Si_3N_4$, is disposed on the $Al_2O_3$ layer 34. The insulating layer 36 has an elongated window 37 in it which exposes all of the LEDs 28 (although for the sake of convenient illustration, FIG. 1 only shows two of the LEDs 28 that are exposed by window 37). A plurality of interconnection conductors 38 are electrically connected to the p-GaAsP regions 32 and extend to a plurality of pads (not shown) of the LED array 28, respectively. The interconnection conductors 38 have narrow-width segments 40 which are in ohmic contact with the p-GaAsP regions 32 and which have stepped portions 42 where they extend upward from a surface of the p-GaAsP regions 32 to the surface of the exposed Al2O3 layer 34. The interconnection conductors 38 also have wide-width segments 42 with further stepped portions 46 where they extend upward from the surface of the exposed $Al_2O_3$ layer 34 to the top surface of the insulating layer 36, at the lower edge (with respect to FIG. 1) of window 37. The wide-width segments 44 are preferably at least one and a half or two times as wide as the narrow-width segments 40, with at least three times as wide being better still.

Figure 9:
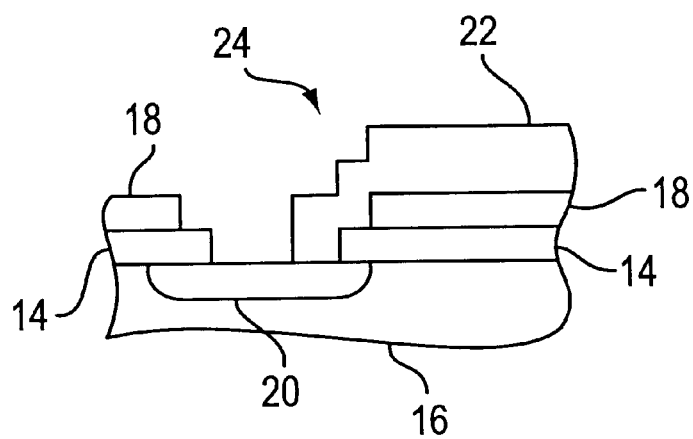
FIG. 9 is a cross-sectional view taken on line 9—9 of FIG 8.

In general, when the interconnection conductors 38 are etched during fabrication of the LED array 26 (which will be described later), etchant tends to gather at stepped portions 42 and 46. It is difficult to remove all traces of the etchant from crevice regions 43 and 47 (see FIG. 5(f)) after a patterning step for making the interconnection conductors 38 has been completed. Moving stepped portion 46 away from the stepped portion 42 thus reduces the residue of accumulated etchant in a small area of narrow-width segment 40, and this improves the reliability of the narrow-width segment 40. Furthermore, the portion of the etchant that gathers in crevice region 47 does little harm because stepped portion 46 is located is wide-width segment 44. In short, the configuration shown in FIGS. 1 and 5(f) reduces the etchant residue where interconnection conductors 39 are most delicate (that is, narrow-width segment 40) by transferring one of the steps, and thus also the portion of the etchant that this step tends to accumulated, to more robust portions of the interconnection conductors 38 (that is, to wide-width segments 44). Moreover, during the patterning step the etchant etches horizontally (with respect to FIG. 5(*f*)) as well as vertically, and this produces a slight undercut at the stepped portions when they are etched (although this undercut is not shown in the Figures for the sake of convenient illustration). Moving the stepped portions 46 back from the stepped portions 42, to wide-width segments 44, means that the undercutting at stepped portions 46 does no harm The prior art configuration shown in FIG. 9 suffers from a tendency for the interconnection conductor 22 to be thin at the stepped portion 24, leading to a relatively high current density or current concentration which might destroy the interconnection conductor, and the present embodiment avoids this problem.

The interconnection conductors 38 have narrow-width segments located on the p-GaAsP regions 32 so that the LED array 26 is able to have wide light outputting areas of the light emitting regions 32.

Accordingly, the first embodiment of the present invention is able to free from a disconnection due to a current concentration without sacrificing the light outputting efficiency of the LED array 26.

(B) Second Embodiment of a Light Emitting Diode Array

Figure 2:
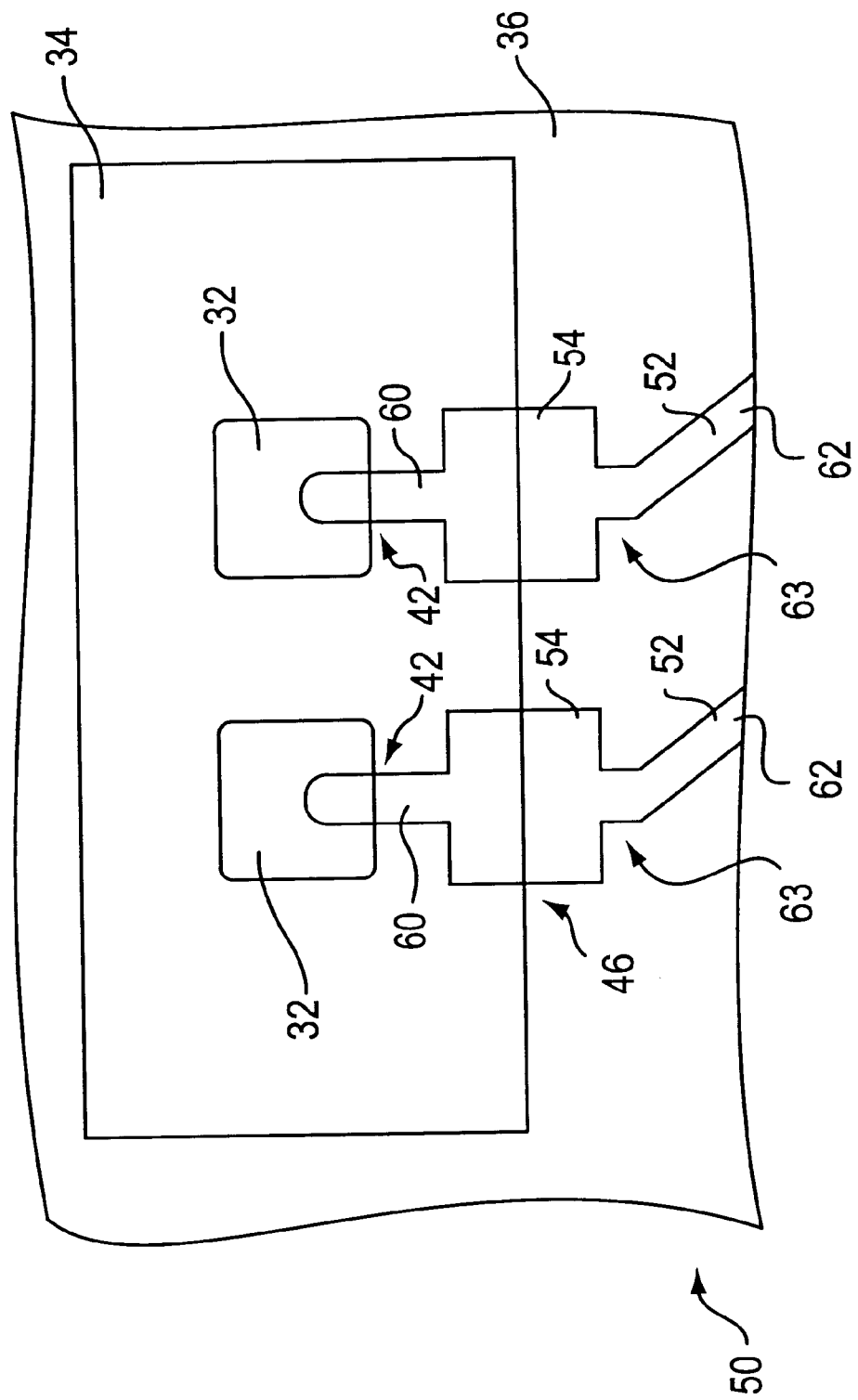
FIG. 2 is an enlarged plan view showing a portion of a light emitting diode array according to a second embodiment of the present invention.

Referring to FIG. 2, there is shown a portion of an LED array 50 according to a second embodiment of a present invention.

Like the first embodiment, the LED array 50 according to the second embodiment comprises a Al$_2$O$_3$ layer 34 acting as a diffusion prevention layer, an insulating layer 36 such as Si$_3$N$_4$ having an elongated window in it, and a plurality of p-GaAsP regions 32 which are formed in an N-GaAs substrate and which act as light emitting regions. A plurality of interconnection conductors 63 in the second embodiment electrically connect a surface of the p-GaAsP regions 32 with a plurality of pads (not shown). The interconnection conductors 63 are in ohmic contact with the p-GaAsP regions 32 and extend upward via stepped portions 42, 46 from the p-GaAsP regions 32 to the upper surface of the insulating layer 36.

The interconnection conductors 63 have first narrow-width segments 60 which are in ohmic contact with the surface of the p-GaAsP regions 32 and which have stepped portions 42 where they extend upward from a surface of the p-GaAsP regions 32 to the surface of the exposed Al$_2$O$_3$ layer 34. The interconnection conductors 63 have a second narrow-width segments 62 located on the top surface of the insulating layer 36. The interconnection conductors 63 also have wide-width segments 54 with further stepped portions 46 where they extend upward from the surface of the exposed Al$_2$O$_3$ layer 34 to the top surface of the insulating layer 36.

In general, the interconnection conductors 63 located on the stepped portions 46 are etched by etchant which gathers between the interconnection conductors 63 and the stepped portions 46 during a patterning step of the interconnection conductors 63 As a result, when the interconnection conductors 63 located on the stepped portions 46 are thinner than the interconnection conductors 63 located on the insulating layer 36, the interconnection conductors 63 located on the stepped portions 46 are easy to be destroyed by a current concentration. However, since the interconnection conductors 63 have the wide-width segments 44 where stepped portions 46 occur, the interconnection conductors 63 located on the stepped portions 46 are free from a disconnection due to a current concentration.

The interconnection conductors 63 have the first narrow-width segments 60 located on the p-GaAsP regions 32 so that the LED array 50 is able to have wide light outputting areas of the light emitting regions 32.

Furthermore, since the interconnection conductors 63 also have the second narrow-width segments 62 located on the insulating layer 36, the distance between the light emitting region and a pad (not shown) can be reduced. Therefore, the chip size of the LED array in a direction perpendicular to the array direction of the LED array can be reduced.

Accordingly, the second embodiment of the present invention is able to be free from a disconnection due to a current concentration without sacrificing the light outputting efficiency of the LED array 50. Furthermore, the second embodiment of the present invention has the advantage of reducing the chip or die area of the LED array 50 and therefore it is able to achieve a low cost.

(C) Third Embodiment of a Light Emitting Diode Arrays

Figure 3:
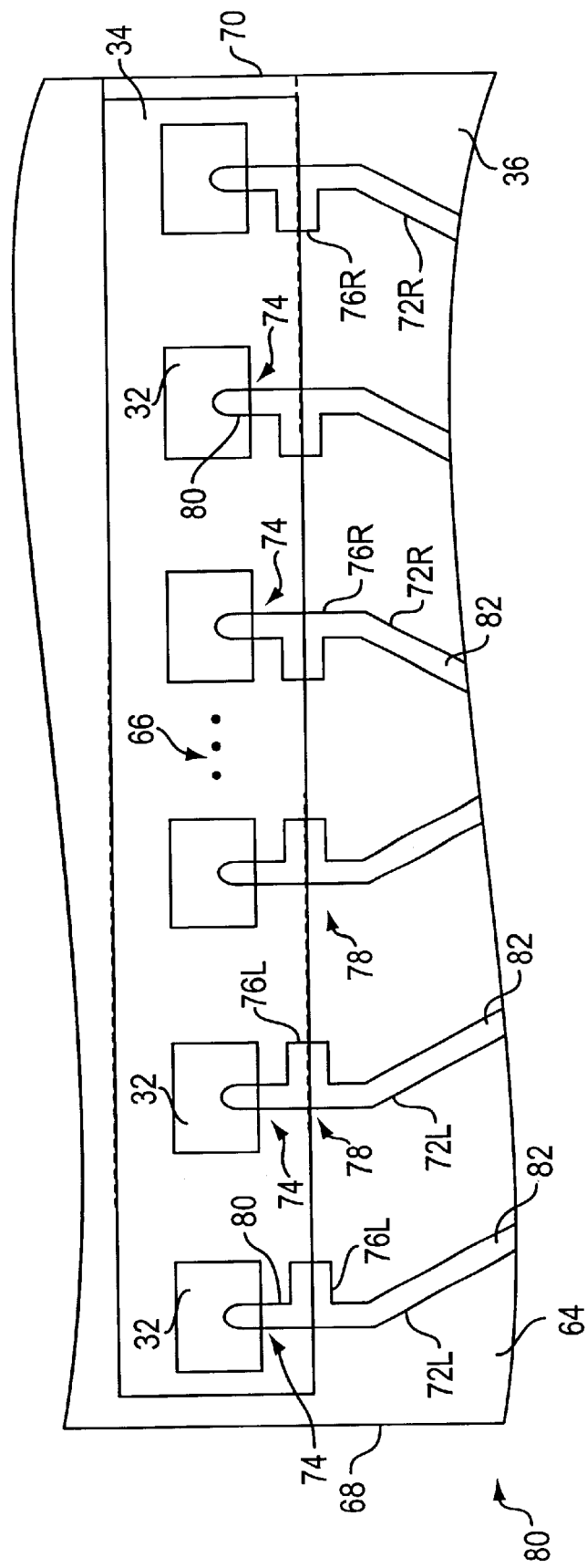
FIG. 3 is an enlarged plan view showing a portion of a light emitting diode array according to a third embodiment of the present invention.

Referring to FIG. 3, there is shown a portion of an LED array 80 according to a third embodiment of the present invention.

The LED array 80 according to the third embodiment also comprises an Al$_2$O$_3$ layer 34 acting as a diffusion prevention layer, an insulating layer 36 such as Si$_3$N$_4$ having an elongated window in it, and a plurality of p-GaAsP regions 32 which are formed in an N-GaAs substrate and which act as a light emitting region. Reference number 66 identifies dots which are intended to indicate that LED array 80 has many more LEDs than are shown, in a central region away from the left and right edges 68 and 70 of the chip or die. A plurality of interconnection conductors 72L on the left side and a plurality of interconnection conductors 72R on the right side electrically connect the p-GaAsP regions 32 with a plurality of pads (not shown). The interconnection conductors 72L and 72R are in ohmic contact with a surface of the p-GaAsP regions 34 and have stepped portions 74 which extend from the p-GaAsP regions 32 to a exposed Al$_2$O$_3$ layer 34. The interconnection conductors 72L have a plurality of wide-width segments 76L with stepped portions 78 which extend from the exposed Al$_2$O$_3$ layer 34 to a top surface of the insulating layer 36. Similarly, the interconnection conductors 72R are provided with wide-width segments 76R having stepped portions which extend from the exposed Al$_2$O$_3$ layer 34 to a top surface of the insulating layer 36. The wide-width segments 76L extend away from the left edge 68 of the die and the wide-width segments 76R extend away from the right edge 70 of the die. Consequently, interconnection conductors 72L and 72R can be located relatively close to the edges 68 and 70 of the die even if the tolerance is relatively large when the die is cut from the semiconductor slice (not shown).

In general, the interconnection conductors 72L, 72R located on the stepped portions 78 are etched by etchant which gathers between the interconnection conductors 72L, 72R and the stepped portions 78 during a patterning step of the interconnection conductors 72L, 72R. As a result, when the interconnection conductors 72L, 72W located on the stepped portions 78 are thinner than the interconnection conductors 72L, 72R located on the insulating layer 36, the interconnection conductors 72L, 72R located on the stepped portions 46 are easy to be destroyed by a current concentration. However, since the interconnection conductors 72L, 72R have the wide-width segments 76L, 76R where stepped portions 78 occur, the interconnection conductors 72L, 72R located on the stepped portions 78 are free from a disconnection due to a current concentration.

The interconnection conductors 72L, 72R have the first narrow-width segments 80 located on the p-GaAsP regions 32 so that the LED array 50 is able to have wide light outputting areas of the light emitting regions 32.

Furthermore, since the interconnection conductors 72L, 72R also have the second narrow-width segments 82 located on the insulating layer 36, the distance between the light emitting region and a pad (not shown) can be reduced. Therefore, the chip size of the LED array in a direction perpendicular to the array direction of the LED array can be reduced.

The fact that the wide-width segments 76L and 76R of the interconnection conductors 72L, 72R extend away from the edges 68 and 70 of the die means that the interconnection conductors can be located relatively close to the edges even if relatively large tolerance limits are used when the die is cut.

Accordingly, the second embodiment of the present invention is able to free from a disconnection due to a current concentration without sacrificing the light outputting efficiency of the LED array 80. Furthermore, the second embodiment of the present invention has the advantage of reducing the chip or die area of the LED array 80 and therefore it is able to achieve a low cost. Furthermore in this embodiment the interconnection conductors 72L, 72R can be located relatively close to the edges of the die. Therefore, this embodiment is able to achieve a reduction in the area of the die and it is also able to secure a margin for cutting the die.

(D) Fourth Embodiment of a Light Emitting Diode Array

Figure 4:
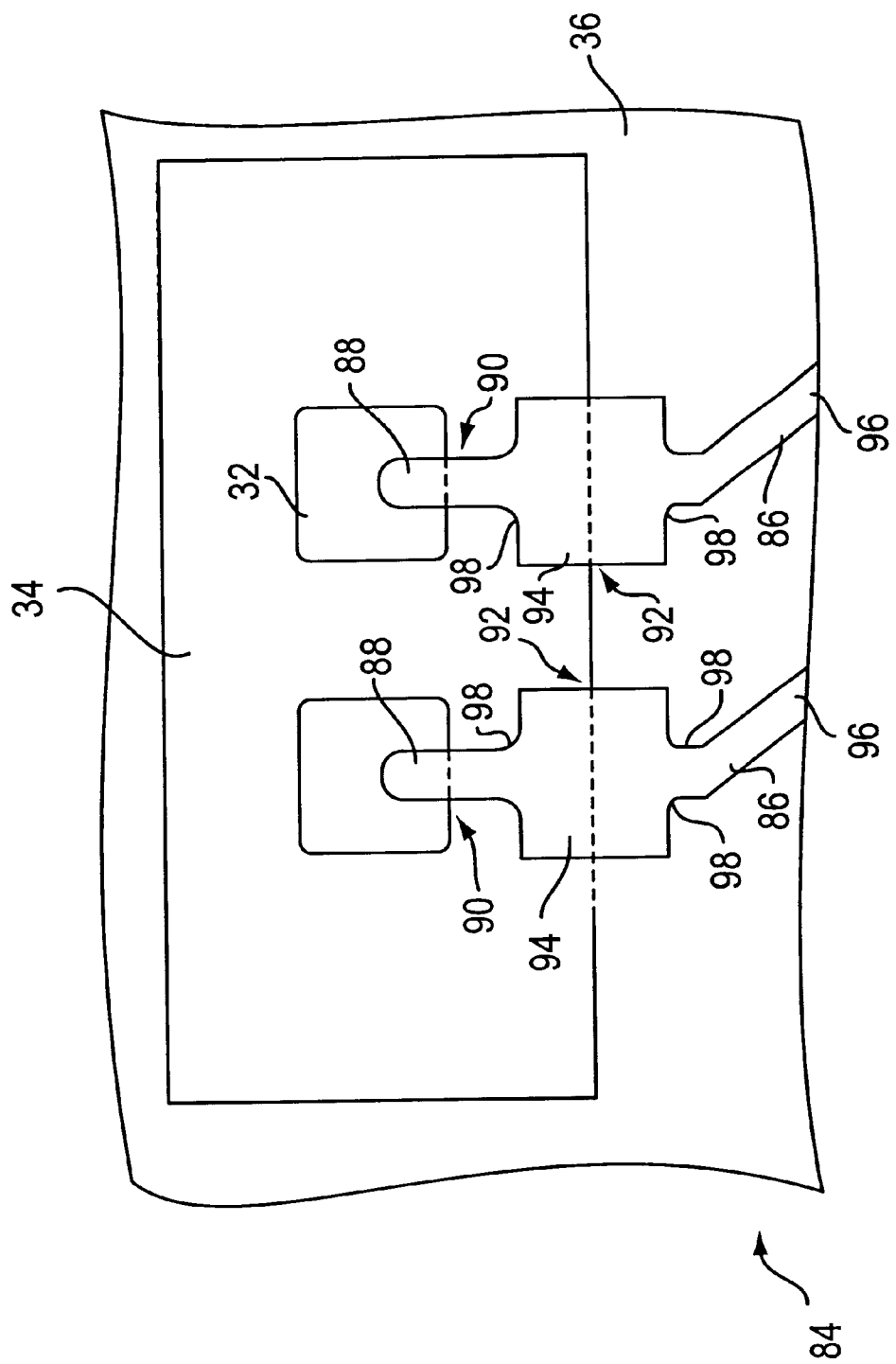
FIG. 4 is an enlarged plan view showing a portion of a light emitting diode array according to a fourth embodiment of the present invention.

Referring to FIG. 4, there is shown a portion of an LED array 84 according to a fourth embodiment of the present invention.

The LED array 84 also comprises an $Al_2O_3$ layer 34 acting as a diffusion prevention layer, an insulating layer 36 such as $Si_3N_4$ having an elongated window in it, and a plurality of p-GaAsP regions 32 which are formed in an N-GaAs substrate and which act as light emitting regions. A plurality of interconnection conductors 86 electrically connect a surface of the p-GaAsP regions 32 with a plurality of pads (not shown) of the LED array 84. The interconnection conductors 86 have narrow-width segments 88 which are in ohmic contact with the surface of the p-GaAsP regions 32 and extend upward via stepped portions 90 from the surface of the p-GaAsP regions 32 to the upper surface of the insulating layer 36. The interconnection conductors 86 have further stepped portions 92 which extend from the p-GaAsP regions 32 to a exposed $Al_2O_3$ layer 34. The stepped portions 92 are located in wide-width segments 94 of the interconnection conductors 86 Additional narrow-width segments 96 extend from the segments 94 to the pads (not shown). The peripheries of interconnection conductors 86 have arcuate-shaped regions 98 where the wide-width segments join the narrow-width segments 88 and 96.

In general, the interconnection conductors 86 located on the stepped portions 92 are etched by etchant which gathers between the interconnection conductors 86 and the stepped portions 92 during a patterning step of the interconnection conductors 86. As a result, when the interconnection conductors 86 located on the stepped portions 92 are thinner than the interconnection conductors 86 located on the insulating layer 36, the interconnection conductors 86 located on the stepped portions 92 are easy to be destroyed by a current concentration. However, since the interconnection conductors 63 have the wide-width segments 94 where stepped portions 92 occur, the interconnection conductors 86 located on the stepped portions 92 are free from a disconnection due to a current concentration.

The interconnection conductors 86 have the first narrow-width segments 88 located on the surface of the p-GaAsP regions 32 so that the LED array 84 is able to have wide light outputting areas of the light emitting regions 32.

Since the interconnection conductors 86 also have the second narrow-width segments 96 located on the insulating layer 36, the distance between the light emitting region and a pad (not shown) can be reduced. Therefore, the chip size of the LED array in a direction perpendicular to the array direction of the LED array can be reduced.

Furthermore, the interconnection conductors 86 are able to prevent a direct influence of an electric field at the transitions from the wide-width segments 94 to the narrow-width segments 88 and 96.

Accordingly, the fourth embodiment of the present invention is able to be free from a disconnection due to a current concentration without sacrificing the light outputting efficiency of the LED array 50. Furthermore, the fourth embodiment of the present invention has the advantage of reducing the chip or die area of the LED array 50 and therefore it is able to achieve a low cost. Furthermore, the fourth embodiment of the present invention is able to prevent a direct influence of an electric field at the transitions from the wide-width segments 94 to the narrow-width segments 88 and 96.

(E) First Embodiment of a Method of Forming a Light Emitting Diode Array

A first embodiment of a method of forming an LED array according to the present invention will hereinafter be described in detail with reference to FIGS. 5(a)–5(f). The LED array formed during the first embodiment of the method is, in fact, the LED array 26 shown in FIG. 1.

The process for fabricating the array 26 in accordance with the first embodiment of the method of the present invention is as follows:

First, in FIG. 5(a), the $Al_2O_3$ layer 34 acting as the diffusion prevention layer is formed on the N-GaAs substrate 30. Then, portions of the $Al_2O_3$ layer 34 located where the light emitting regions are to be are removed using a known photolithography process to form windows (FIG. 5(b)). Then, a P-type impurity, such as Zn, is diffused onto the surface of the N-GaAs substrate 30 at the windows by the vapor diffusion method. As a result, the p-GaAsP regions 32 acting as the light emitting regions are formed on the N-GaAs substrate 30 (FIG. 5(c)). Then, the insulating layer 36, such as a $Si_3N_4$, is formed on the $Al_2O_3$ layer 34 and the window 37 (see FIG. 1) is etched (FIG. 5(d)). An Al film 102 is then deposited so as to cover the insulating layer 36 and the p-GaAsP regions 32 (FIG. 5(e)). Then, a mask layer (not shown) such as a photoresist, is formed on predetermined portions of the Al film 102, using a known photolithography process. The mask layer has wide-width segments which correspond to the side-width segments 44 shown in FIG. 1, and narrow-width segments corresponding to the segments 40. The Al film 102 is etched using the mask layer. As a result, the interconnection conductors 38 shown in FIG. 1 are formed (FIG. 5(f)). A known annealing process is then used to ensure good ohmic contact between the p-GaAsP regions 32 and the interconnection conductors 38.

The first embodiment of the present invention is able to prevent the risk of cutting the interconnection conductors 38 due to etchant which gathers at the stepped portions 46 (see FIG. 1) and which may not be adequately removed during the interconnection conductor patterning step.

(F) Second Embodiment of a Method of Forming a Light Emitting Diode Array

A second embodiment of a method according to the present invention for forming an LED array will hereinafter be described in detail with reference to FIGS. 6(a)–6(i). The initial steps are substantially the same as in the first embodiment of the method, and the same reference numbers will be used for them.

First the Al$_2$O$_3$ layer 34 acting as a diffusion prevention layer is formed in the N-GaAs substrate 30 (FIG. 6(*a*)). Then, portions of the Al$_2$O$_3$ layer 34 located where the light emitting regions are destined to be are removed using a known photolithography process to form windows (FIG. 6(*b*)). Then, a P-type impurity, such as Zn, is diffused into the surface of the N-GaAs substrate 30 at the windows by the vapor diffusion method. As a result, p-GaAsP regions 32 acting as light emitting regions are formed on the N-GaAs substrate 30 (FIG. 6(*c*)). Then, the insulating layer 36, such as Si$_3$N$_4$, is formed on the Al$_2$O$_3$ layer 34.

At this point, the second embodiment of the method departs from the first embodiment of the method. Small windows are etched in the layer 36 around each light emitting region 32, instead of a wide elongated window (e.g., window 37 in FIG. 1) which surrounds them all (FIG. 6(*d*)). An Al film 104 is deposited so as to cover the insulating layer 36 and the p-GaAsP regions 32 (FIG. 6(*e*)). The Al film 104 is thicker than the Al film 102 shown in FIG. 5(*e*). Then, in FIG. 6(*f*), a first mask layer 106, such as a photoresist, is selectively formed on the Al film 104, using a known photolithography process at locations where the interconnection conductors are to have stepped portions adjacent the regions 32 (for example, corresponding to the stepped portions 42 shown in FIG. 1). The Al film 104 is then etched using the first mask layer (FIG. 6(*g*)). After the first mask layer 106 is removed, a second mask layer 108 is selectively formed on the Al film 104 so as to have portions which extend from the p-GaAsP regions 32 and over the insulating layer 36 to pads (not shown) which are to be provided for the LED array (FIG. 6(*h*)). The portions of the second mask layer 108 preferably have narrow-width segments and wide-width segments in order to provide interconnection conductors with corresponding narrow and wide-width segments (for example, segments 40 and 44 in FIG. 1). The Al film 104 is etched using the second mask layer. Therefore, interconnection conductors 110 (only one of which is shown) are formed (FIG. 6(*i*)). A known annealing process is then used to ensure good ohmic contact between the p-GaAsP regions 32 and the interconnection conductors 110.

The second embodiment of the method of the present invention is able to prevent the risk of cutting the interconnection conductors 110 due to etchant which gathers on the stepped portions 114 between p-GaAsP regions 32 and the insulating layer 36 during the interconnection layer patterning step. It is also able to achieve a reduction in the area of an LED array, and thus reduce costs.

Although individual windows are etched in the insulating layer 36 in this embodiment, it would also be possible to use a single large window (e.g., window 37 in FIG. 1) in order to move the stopped region at the edge of layer 35 back from the stepped region at the edge of layer 34.

(G) Third Embodiment of a Method of Forming a Light Emitting Diode Array

A third embodiment of a method according to the present invention for forming an LED array will hereinafter be described in detail with reference to FIGS. 7(*a*)–7(*i*). The initial steps are the same as in the first embodiment of the method, and the same reference numbers will be used for them.

First, the Al$_2$O$_3$ layer 34 acting as a diffusion prevention layer is formed on the N-GaAs substrate 30 (FIG. 7(*a*)). Then, portions of the Al$_2$O$_3$ layer 34 located where the light emitting regions are to be are removed using a known photolithography process to form windows (FIG. 7(*b*)). Then, a P-type impurity, such as Zn, is diffused into the surface of the N-GaAs substrate 30 at the windows by the vapor diffusion method. As a result, p-GaAsP regions 32 acting as light emitting regions are formed on the N-GaAs substrate 30 (FIG. 7(*c*)). Then, the insulating layer 36, such as Si$_3$N$_4$, is formed on the Al$_2$O$_3$ layer 34.

At this point, the third embodiment of the method departs from the first embodiment of the method. Small windows are etched in the layer 36 around each light emitting region 32, instead of a wide elongated window (e.g., window 37 in FIG. 1) which surrounds them all (FIG. 7(*d*)). A first mask layer 116, such as photoresist, is formed on the p-GaAsP regions 32 and the insulating layer 36, except for staircase regions 118 (FIG. 7(*e*)). Then, a plurality of metal layers 120 having a high etch selectivity with respect to the material which is to be used for the interconnection conductors, for example AuBe or AuZn, are formed on the staircase regions 118 and the first mask layer (FIG. 7(*f*). Here, "high etch selectivity" is intended to mean that the metal of layers 120 etches at a much slower rate than the material for the interconnection conductors.

Metal staircase elements 122 are selectively formed on the staircase regions 118 by removing the first mask layer 116 (FIG. 7(*g*)). Then, an Al film 124 is deposited so as to cover the insulating layer 36, the staircase elements 122, and the p-GaAsP regions 32 (FIG. 7(*h*)). A second mask layer, such as a photoresist (not shown), is then formed on the Al film 124. The second mask layer preferably has wide-width and narrow-width portions, which correspond to the wide-width width segments 44 and the narrow-width segments 40 in FIG. 1, for example. Then, the Al film 124 is etched using the second mask layer. Therefore, a plurality of interconnection conductors 126 having stepped portions 128 are formed (FIG. 7(*i*)). A known annealing process is then used to ensure good ohmic contact between the p-GaAsP regions 32 and the staircase elements 122 of the interconnection conductors 126.

The third embodiment of the method of the present invention Is able to prevent the risk of cutting the interconnection conductors 126 due to etchant which gathers at the stepped portions 128 between the p-GaAsP regions 32 and the insulating layer 36 and which may not be adequately removed during the interconnection conductor patterning step. It is also able to achieve a reduction in the area of an LED array and therefore reduce costs.

It is also possible to achieve a low contact resistance between the p-GaAsP regions and the metal of the staircase elements 122, for example, AuBe or AuZn.

Although individual windows are etched in the insulating layer 36 of this embodiment, it would also be possible to use a single large window (e.g., window 37 in FIG. 1) in order to move the stepped region at the edge of layer 36 back from the stepped region at the edge of layer While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of forming a light emitting diode array, comprising the steps of:

providing a semiconductor substrate;

forming a diffusion prevention layer on the semiconductor substrate, the diffusion prevention layer having an edge;

forming a hole in the diffusion prevention layer at a position that is spaced apart from the edge of the diffusion prevention layer;

forming a light emitting region on the substrate beneath the hole;

forming an insulating layer on the diffusion prevention layer, the insulating layer having a level drop at the edge of the diffusion prevention layer, the insulating layer additionally having a hole which is aligned with the hole in the diffusion prevention layer;

covering the light emitting region and the insulating layer with a conductive layer, the conductive layer having a stepped portion at the level drop of the insulating layer;

forming a mask layer on the conductive layer, the mask layer having a wide-width segment located over the stepped portion and a narrow-width segment which extends over the light emitting region; and selectively forming an interconnection conductor by etching the conductive layer using the mask layer.

2. A method of forming a light emitting diode array as claimed in claim 1, wherein the semiconductor substrate comprises N-GaAs, the light emitting region comprises p-GaAsP, the diffusion prevention layer comprises $Al_2O_3$, the insulating layer comprises $Si_3N_4$, the conductive layer comprises Al, and the mask layer comprises a photoresist.

3. A method of forming a light emitting diode array, comprising the steps of:

providing a semiconductor substrate;

forming a diffusion prevention layer on the semiconductor substrate, the diffusion prevention layer having an edge;

forming a hole in the diffusion prevention layer at a position that is spaced apart from the edge of the diffusion prevention layer;

forming a light emitting region on the substrate beneath the hole;

forming an insulating layer on the diffusion prevention layer, the insulating layer having a level drop at the edge of the diffusion prevention layer, the insulating layer additionally having a hole which is aligned with the hole in the diffusion prevention layer;

covering the light emitting region and the insulating layer with a conductive layer, the conductive layer which has a recess that is aligned with the holes;

forming a first mask layer on the conductive layer at a position adjacent the recess in the conductive layer;

conducting a first etching step to reduce the thickness of the conductive layer except beneath the first mask layer;

removing the first mask layer;

forming a second mask layer on the conductive layer, the second mask layer having a wide-width segment and a narrow-width segment which extends over the light emitting region; and selectively forming an interconnection conductor by etching the conductive layer using the second mask layer.

4. A method of forming a light emitting diode array as claimed in claim 3, wherein the semiconductor substrate comprises N-GaAsP the light emitting region comprises p-GaAsP, the diffusion prevention layer comprises $Al_2O_3$, the insulating layer comprises $Si_3N_4$, the conductive layer comprises Al, the first mask layer comprises a photoresist, and the second mask layer comprises photoresist.

5. A method of forming a light emitting diode array as claimed in claim 3, wherein a portion of the narrow-width segment of the second mask layer is located on the insulating layer.

6. A method of forming a light emitting diode array, comprising the steps of:

providing a semiconductor substrate;

forming a diffusion prevention layer on the semiconductor substrate, the diffusion prevention layer having an edge;

forming a hole in the diffusion prevention layer at a position that is spaced apart from the edge of the diffusion prevention layer;

forming a light emitting region on the substrate beneath the hole;

forming an insulating layer on the diffusion prevention layer, the insulating layer having a level drop at the edge of the diffusion prevention layer, the insulating layer additionally having a hole which is aligned with the hole in the diffusion prevention layer;

selectively forming a staircase element having a lower portion which contacts the light emitting region and an upper portion which contacts the insulating layer, the staircase element being made of a first metal;

covering the insulating layer, the staircase element, and the light emitting region with a layer of a second metal which has a faster etch rate than the first metal;

forming a mask layer on the conductive layer; and selectively forming an interconnection conductor by etching the layer of the second metal using the mask layer.

7. A method of forming a light emitting diode array as claimed in claim 6, wherein the first metal comprises AuBe or AuZn and the second metal comprises Al.

8. A method of forming a light emitting diode array as claimed in claim 6, wherein the semiconductor substrate comprises N-GaAs, the light emitting region comprises p-GaAsP, the diffusion prevention layer comprises $Al_2O_3$, the insulating layer comprises $Si_3N_4$, the second metal comprises Al, and the mask layer comprises a photoresist.

9. The method of claim 1, wherein the narrow-width segment of the mask layer is a first narrow-width segment that joins the wide-width segment, and wherein the mask layer additionally has a second narrow-width segment that joins the wide-width segment, the wide-width segment being disposed between the first and second narrow-width segments.

10. A method of forming a light emitting diode array, comprising the steps of:

providing a semiconductor substrate;

forming a diffusion prevention layer on the semiconductor substrate, the diffusion layer having an edge;

forming a hole in the diffusion prevention layer at a position that is spaced apart from the edge of the diffusion prevention layer;

forming a light emitting region on the substrate beneath the hole;

forming an insulating layer on the diffusion prevention layer, the insulating layer having a level drop at the edge of the diffusion prevention layer, the insulating layer additionally having a hole which is aligned with the hole in the diffusion prevention layer;

covering the light emitting region and the insulating layer with a conductive layer, the conductive layer which has a recess that is aligned with the holes;

forming a first mask layer on the conductive layer at a position adjacent the recess in the conductive layer;

conducting a first etching step to reduce the thickness of the conductive layer except beneath the first mask layer;

removing the first mask layer;

forming a second mask layer on the conductive layer; and selectively forming an interconnection conductor by etching the conductive layer using the second mask layer.

11. A method of forming a light emitting diode array as claimed in claim 10, wherein the semiconductor substrate comprises N-GaAs, the light emitting region comprises p-GaAsP, the diffusion prevention layer comprises $Al_2O_3$, the insulating layer comprises $Si_2N_3$, the conductive layer comprises Al, the first mask layer comprises a photoresist, and the second mask layer comprises photoresist.

* * * * *